(12) United States Patent
Bi et al.

(10) Patent No.: US 11,302,797 B2
(45) Date of Patent: Apr. 12, 2022

(54) APPROACH TO BOTTOM DIELECTRIC ISOLATION FOR VERTICAL TRANSPORT FIN FIELD EFFECT TRANSISTORS

(71) Applicant: INTERNATIONAL BUSINESS MACHINES CORPORATION, Armonk, NY (US)

(72) Inventors: Zhenxing Bi, Dunn Loring, VA (US); Thamarai S. Devarajan, Niskayuna, NY (US); Balasubramanian Pranatharthiharan, Watervliet, NY (US); Sanjay C. Mehta, Niskayuna, NY (US); Muthumanickam Sankarapandian, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 47 days.

(21) Appl. No.: 16/799,237

(22) Filed: Feb. 24, 2020

(65) Prior Publication Data
US 2020/0212202 A1    Jul. 2, 2020

Related U.S. Application Data

(62) Division of application No. 15/860,957, filed on Jan. 3, 2018, now Pat. No. 10,629,702, which is a division
(Continued)

(51) Int. Cl.
*H01L 29/66* (2006.01)
*H01L 29/06* (2006.01)
(Continued)

(52) U.S. Cl.
CPC .... *H01L 29/66553* (2013.01); *H01L 29/0649* (2013.01); *H01L 29/4966* (2013.01);
(Continued)

(58) Field of Classification Search
CPC ............. H01L 29/0649; H01L 29/4966; H01L 29/7827; H01L 29/66553; H01L 29/66666; H01L 29/78642
See application file for complete search history.

(56) References Cited

U.S. PATENT DOCUMENTS 6,693,013 B2    2/2004   Bae et al.
6,970,372 B1   11/2005   Furukawa et al.
(Continued)

FOREIGN PATENT DOCUMENTS

JP        2005 501424 A        6/2009

OTHER PUBLICATIONS

List of IBM Patents or Patent Applications Treated as Related dated Feb. 24, 2020, 2 pages.
(Continued)

*Primary Examiner* — Vongsavanh Sengdara
(74) *Attorney, Agent, or Firm* — Tutunjian & Bitetto, P.C.; Samuel Waldbaum

(57) ABSTRACT

A vertical transport fin field effect transistor (VT FinFET), including one or more vertical fins on a surface of a substrate, an L-shaped or U-shaped spacer trough on the substrate adjacent to at least one of the one or more vertical fins, and a gate dielectric layer on the sidewalls of the at least one of the one or more vertical fins and the L-shaped or U-shaped spacer trough.

10 Claims, 13 Drawing Sheets

Related U.S. Application Data of application No. 15/425,496, filed on Feb. 6, 2017, now Pat. No. 10,840,354.

(51) Int. Cl.
*H01L 29/49* (2006.01)
*H01L 29/78* (2006.01)
*H01L 29/786* (2006.01)

(52) U.S. Cl.
CPC .... *H01L 29/66666* (2013.01); *H01L 29/7827* (2013.01); *H01L 29/78642* (2013.01)

(56) References Cited

U.S. PATENT DOCUMENTS

| | | |
|---|---|---|
| 7,488,659 B2 | 2/2009 | Dyer |
| 7,871,869 B2 | 1/2011 | Cartier et al. |
| 8,404,592 B2 | 3/2013 | Luning et al. |
| 8,937,369 B2 | 1/2015 | Liu et al. |
| 9,252,018 B2 | 2/2016 | Mo et al. |
| 9,299,835 B1 | 3/2016 | Anderson et al. |
| 9,368,572 B1 | 6/2016 | Cheng et al. |
| 9,378,975 B2 | 6/2016 | Parkinson et al. |
| 9,397,226 B2 | 7/2016 | Basu et al. |
| 2007/0020855 A1* | 1/2007 | Kim .............. H01L 27/0886 438/268 |
| 2007/0132009 A1 | 6/2007 | Takeuchi et al. |
| 2014/0084381 A1 | 3/2014 | Yeh et al. |
| 2015/0129962 A1 | 5/2015 | Xie et al. |
| 2015/0137263 A1* | 5/2015 | Lee .............. H01L 21/02233 257/401 |
| 2015/0236086 A1 | 8/2015 | Colinge et al. |
| 2015/0372140 A1* | 12/2015 | Liu .............. H01L 21/3083 257/190 |

OTHER PUBLICATIONS

International Search Report and Written Opinion dated May 29, 2018 from corresponding UK Patent Application No. PCT/IB2018/050287.

Notice of Reasons for Refusal issued in corresponding Japanese Patent Application No. 2019-541395 dated May 17, 2021 (4 pgs).

* cited by examiner ent invention, a method of forming a vertical transport fin field
APPROACH TO BOTTOM DIELECTRIC ISOLATION FOR VERTICAL TRANSPORT FIN FIELD EFFECT TRANSISTORS

BACKGROUND

Technical Field

The present invention generally relates to formation of a bottom spacer that is independent of vertical fin density, and more particularly to forming an insulating dielectric trough as a part of a bottom spacer.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin approximately rectangular Si, commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a vertical transport fin field effect transistor (VT FinFET), including one or more vertical fins on a surface of a substrate, an L-shaped or U-shaped spacer trough on the substrate adjacent to at least one of the one or more vertical fins, and a gate dielectric layer on the sidewalls of the at least one of the one or more vertical fins and the L-shaped or U-shaped spacer trough is provided.

In accordance with another embodiment of the present invention, a method of forming a vertical transport fin field effect transistor, including, forming one or more vertical fins on a substrate, forming a spacer layer on the substrate and exposed surfaces of the one or more vertical fins, forming a gauge layer on the spacer layer, removing a portion of the gauge layer to form one or more gauge sections on the spacer layer, where a portion of the spacer layer on the one or more vertical fins is exposed by removing the portion of the gauge layer, and removing the exposed portion of the spacer layer to form an L-shaped or U-shaped spacer trough is provided.

In accordance with yet another embodiment of the present invention, a method of forming a vertical transport fin field effect transistor, including, forming one or more vertical fins on a substrate, forming a liner layer on the substrate and exposed surfaces of the one or more vertical fins, forming a spacer layer on at least a portion of the liner layer, forming a gauge layer on the spacer layer, removing a portion of the gauge layer to form one or more gauge sections on the spacer layer, where a portion of the spacer layer on the one or more vertical fins is exposed by removing the portion of the gauge layer, removing the exposed portion of the spacer layer, wherein removing the exposed portion of the spacer layer exposes a portion of the underlying liner layer, and removing the exposed portion of the underlying liner layer on the one or more vertical fins is provided.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
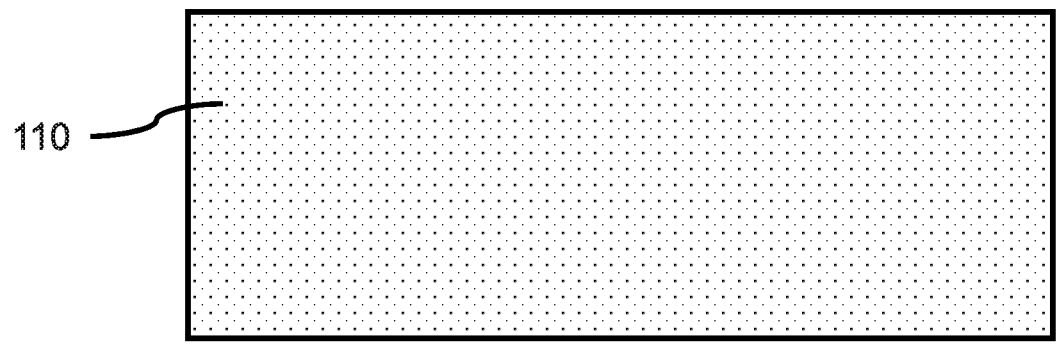
FIG. 1 is a cross-sectional side view showing a substrate, in accordance with an embodiment of the present invention.

Principles and embodiments of the present invention relate generally to forming bottom spacers having a more uniform thickness between vertical fins that may vary in pitch and fin pattern density. The bottom spacer can include two layers formed in a manner that does not vary with the distance between adjacent vertical fins. In various embodiments, an oxide liner layer and a nitride spacer layer can be formed on a substrate and vertical fin(s) by thermal atomic layer deposition (Thermal ALD) or plasma enhanced atomic layer deposition (PEALD) to provide a bottom spacer for a vertical transport field effect transistor (VTFET), where the current flows through the FinFET perpendicularly to the plane of the substrate.

Principles and embodiments of the present invention also relates generally to a U-shaped or L-shaped spacer trough that is conformally deposited on the substrate and vertical fins to have a predetermined thickness that is insensitive to trench width (i.e., inter-fin distance) and geometry. The conformal deposition can reduce or avoid thickness variations, where variability in bottom spacer thickness among neighboring devices can induce device performance variations and instabilities. For example, high density plasma deposited bottom spacer films can vary in thickness by as much as 10%-50% (e.g., about 1 nm to about 4 nm) depending on the degree of pitch variation, shape of fill geometry, re-entrancy, and deposition parameters.

Principles and embodiments of the present invention also relate generally to use of conformal depositions by Thermal ALD or PEALD in place of directional depositions, such as high density plasma (HDP) depositions, Physical Vapor Deposition (PVD), or gas cluster ion beam (GCIB) depositions, to better control the thickness of the layers through monolayer-by-monolayer layer formation. The deposition of a liner layer and a spacer layer by Thermal ALD and/or PEALD can avoid thickness variations due to pitch walking and vertical fin loading (Isolated vs. dense), where variations in fin pitch can cause local depletion of layer forming reactants in denser areas, thereby resulting in different amounts of spacer and liner layer deposition thicknesses especially for the PECVD or HDP processes.

In addition, Thermal ALD and PEALD deposited nitride layers can be potentially achieved at lower thermal budgets, where the ALD or PEALD deposition may be carried out at less than 500° C. Lower thermal budgets can avoid dopant diffusion.

Exemplary applications/uses to which the present invention can be applied include, but are not limited to: logic (e.g., NAND, NOR, XOR, etc.) and memory devices (e.g., SRAM, DRAM, etc.) utilizing vertical transport FinFET devices.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., Thermal ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be a semiconductor or an insulator with an active surface semiconductor layer. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. The substrate 110 can include a carrier layer to support thinner layers.

In one or more embodiments, the substrate 110 can be a silicon wafer. In various embodiments, the substrate can be a single crystal silicon (Si), silicon-germanium (SiGe), or III-V semiconductor (e.g., GaAs) wafer, or have a single crystal silicon (Si), silicon-germanium (SiGe), or III-V semiconductor (e.g., GaAs) surface/active layer.

Figure 2:
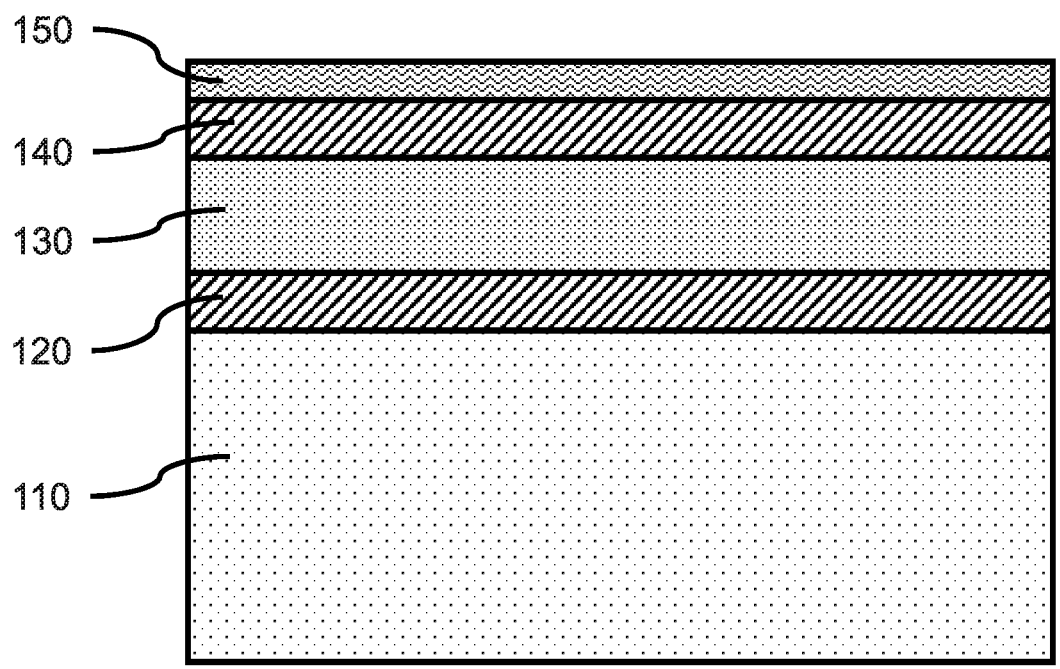
FIG. 2 is a cross-sectional side view showing a fin template layer formed on the surface of the substrate, a mandrel layer formed on the fin template layer, a mandrel template layer formed on the mandrel layer, and a mandrel mask layer formed on the mandrel template layer, in accordance with an embodiment of the present invention.

FIG. 2 is a cross-sectional side view showing a fin template layer formed on the surface of the substrate, a mandrel layer formed on the fin template layer, a mandrel template layer formed on the mandrel layer, and a mandrel mask layer formed on the mandrel template layer, in accordance with an embodiment of the present invention In one or more embodiments, a fin template layer 120 can be formed on at least a portion of a surface of a substrate 110. In various embodiments, the fin template layer 120 can be formed on the substrate surface by CVD, PECVD, PVD, thermal growth, or combinations thereof, where the fin template layer 120 can be blanket deposited on the substrate.

In one or more embodiments, the fin template layer 120 can have a thickness in the range of about 20 nm to about 70 nm, or in the range of about 20 nm to about 50 nm, or in the range of about 50 nm to about 70 nm, or in the range of about 30 nm to about 60 nm, where the thickness of the fin template layer 120 can define the height of subsequently formed source/drain projections. Other thicknesses are also contemplated.

In various embodiments, a fin template layer 120 can be a hard mask layer for masking the substrate during transfer of a vertical fin pattern to the substrate 110. The fin template layer 120 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), titanium nitride (TiN), or combinations thereof, where the fin template layer 120 may include one or more layers. The fin template layer 120 can also act as an etch-stop layer for forming sacrificial mandrels from a mandrel layer, where the fin template layer 120 can be selectively etched relative to other layers.

In one or more embodiments, a mandrel layer 130 can be formed on at least a portion of the fin template layer 120. In one or more embodiments, the mandrel layer 130 can be formed by CVD, PECVD, PVD, a spin-on process, or combinations thereof, where the mandrel layer 130 can be blanket deposited on the fin template layer 120.

In various embodiments, mandrel layer 130 can be a sacrificial material that can be easily and selectively patterned and etched. The mandrel layer 130 can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof.

In one or more embodiments, a mandrel template layer 140 can be formed on the mandrel layer 130, where the mandrel template layer can be a hard mask layer.

The mandrel template layer 140 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the mandrel template layer 140 may include one or more layers.

In one or more embodiments, a mandrel mask layer 150 can be formed on the mandrel template layer 140, where the mandrel mask layer 150 can be a hard mask layer or soft mask layer for masking the mandrel template layer 140. In one or more embodiments, the mandrel mask layer 150 can be a lithographic resist material (e.g., a photo resist material, an e-beam resist material, etc.).

In one or more embodiments, the mandrel mask layer 150 can be a positive or negative resist material, for example, Poly(methyl methacrylate) (PMMA) or SU-8, or an electron-beam (e-beam) cured material, for example, hydrogen silsesquioxane (HSQ).

In one or more embodiments, the mandrel mask layer 150 can be formed on the mandrel template layer 140 by a spin on process.

Figure 3:
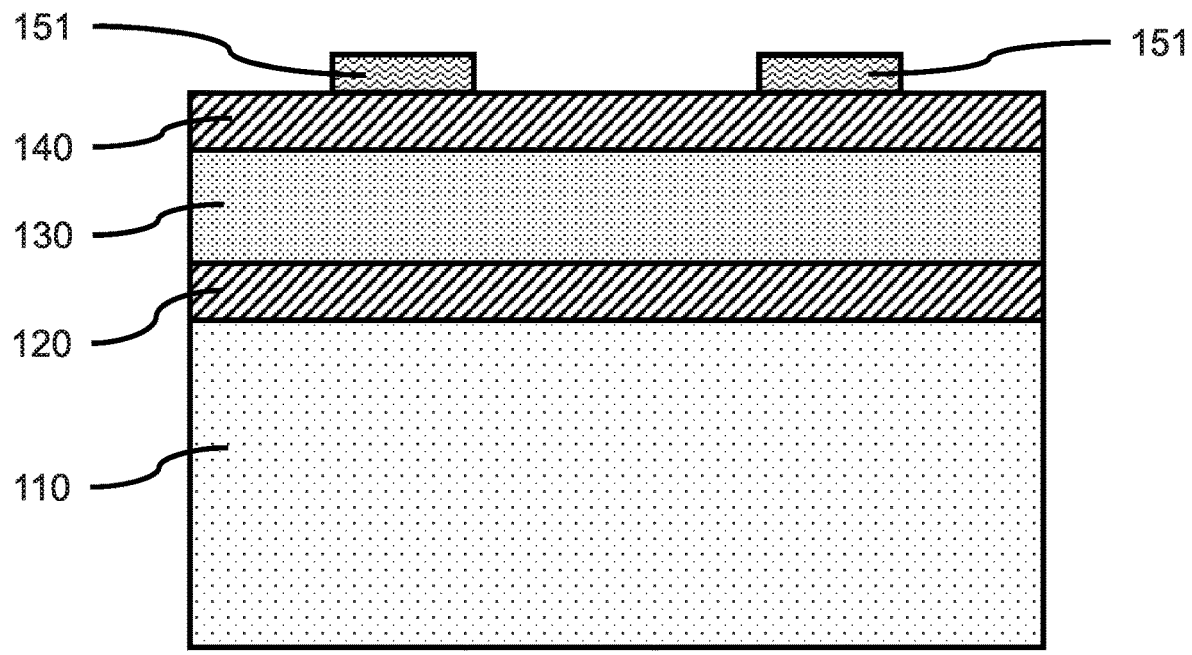
FIG. 3 is a cross-sectional side view showing a patterned mandrel mask layer on the mandrel template layer, in accordance with an embodiment of the present invention.

FIG. 3 is a cross-sectional side view showing a patterned mandrel mask layer on the mandrel template layer, in accordance with an embodiment of the present invention.

In one or more embodiments, the mandrel mask layer 150 can be patterned and developed to form mandrel mask segments 151 on the mandrel template layer 140, where the mandrel mask segments 151 cover portions of the mandrel template layer 140 and expose other portions of the mandrel template layer. The mandrel mask layer 150 can be patterned and developed using processes known in the art.

In various embodiments, the pitch (i.e., center-to-center distance) between adjacent mandrel mask segments 151 can be in the range of about 20 nm to about 60 nm, or in the range of about 20 nm to about 40 nm, which can determine the pitch between vertical fins.

Figure 4:
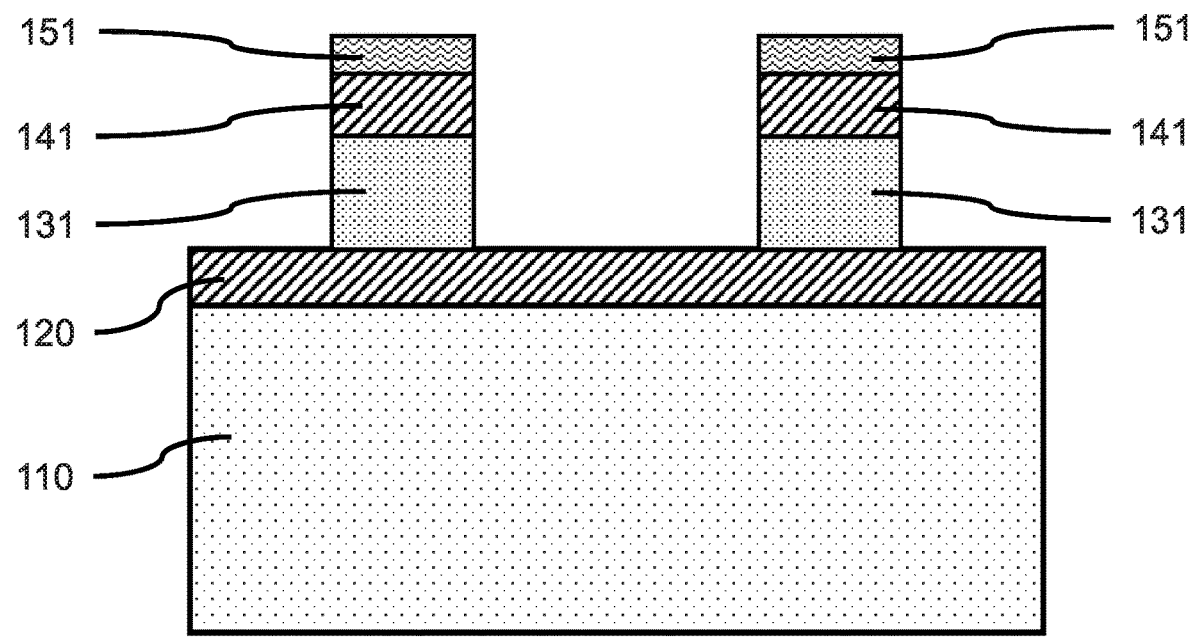
FIG. 4 is a cross-sectional side view showing a patterned mandrel mask layer on the mandrel templates and sacrificial mandrels, in accordance with an embodiment of the present invention.

FIG. 4 is a cross-sectional side view showing a patterned mandrel mask layer on the mandrel templates and sacrificial mandrels, in accordance with an embodiment of the present invention.

In one or more embodiments, the exposed portions of the mandrel template layer 140 can be removed by wet etching or by a dry plasma etch, where the dry plasma can be a directional reactive ion etch (RIE). Removal of the exposed portions of the mandrel template layer 140 can form one or more mandrel templates 141 below the mandrel mask segments 151, and expose underlying portions of the mandrel layer 130. The mandrel templates 141 can be used to transfer the mandrel pattern to the mandrel layer 130.

In one or more embodiments, once the mandrel templates 141 are formed, a directional etch (e.g., RIE) can be used to remove exposed portions of the mandrel layer 130 to form sacrificial mandrels 131 on the underlying fin template layer 120. The one or more sacrificial mandrels 131 can be on the fin template layer 120, where portions of the fin template layer can be exposed between the sacrificial mandrel(s) 131.

Figure 5:
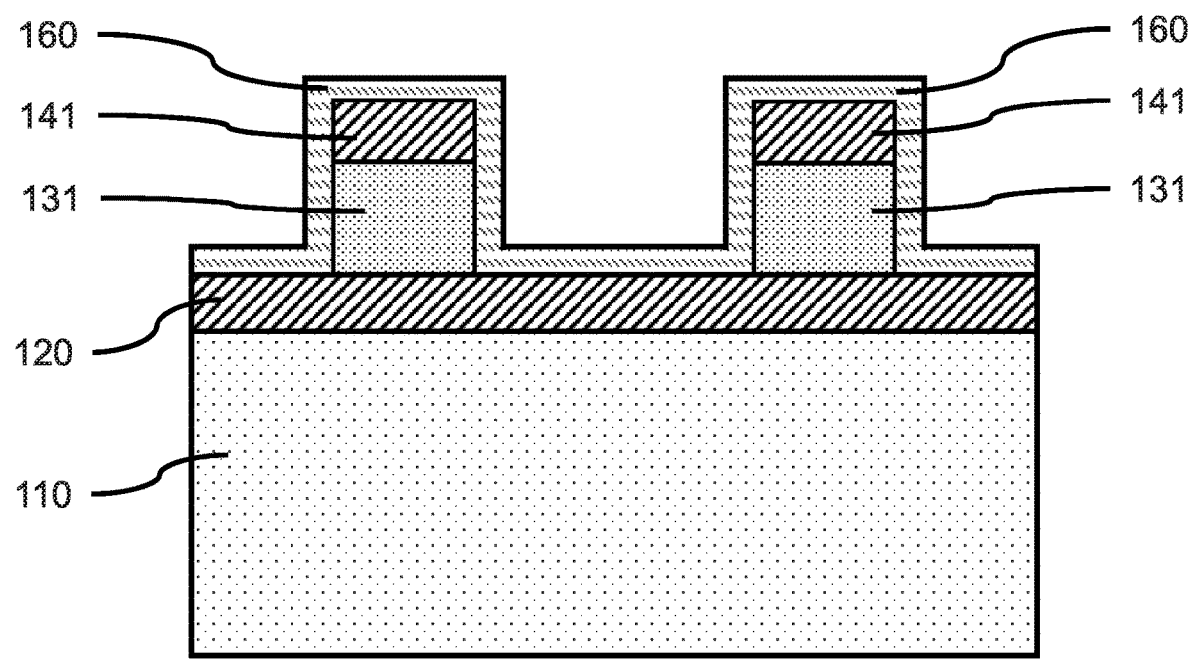
FIG. 5 is a cross-sectional side view showing a sidewall layer formed on the mandrel templates, sacrificial mandrels, and fin template layer, in accordance with an embodiment of the present invention.

FIG. 5 is a cross-sectional side view showing a sidewall layer formed on the mandrel templates, sacrificial mandrels, and fin template layer, in accordance with an embodiment of the present invention.

In one or more embodiments, the mandrel mask segments 151 can be removed to expose the mandrel templates 141 using a process known in the art (e.g., stripping or ashing).

In one or more embodiments, a sidewall spacer layer 160 can be formed on the exposed surfaces of the mandrel templates 141 and sacrificial mandrels 131, where the sidewall spacer layer 160 can be formed by a conformal deposition, for example, Thermal ALD or PEALD, to control the thickness of the sidewall spacer layer 160.

In various embodiments, the sidewall spacer layer 160 can have a thickness in the range of about 4 nm to about 30 nm, or in the range of about 6 nm to about 15 nm, or in the range of about 8 nm to about 12 nm, where the thickness of the sidewall spacer layer 160 can determine the pitch and/or width of subsequently formed vertical fins.

In various embodiments, the sidewall spacer layer 160 can be silicon oxide (SiO), silicon nitride (SiN), silicon oxynitride (SiON), silicon carbide (SiC), conformal amorphous carbon (a-C), or combinations thereof.

Figure 6:
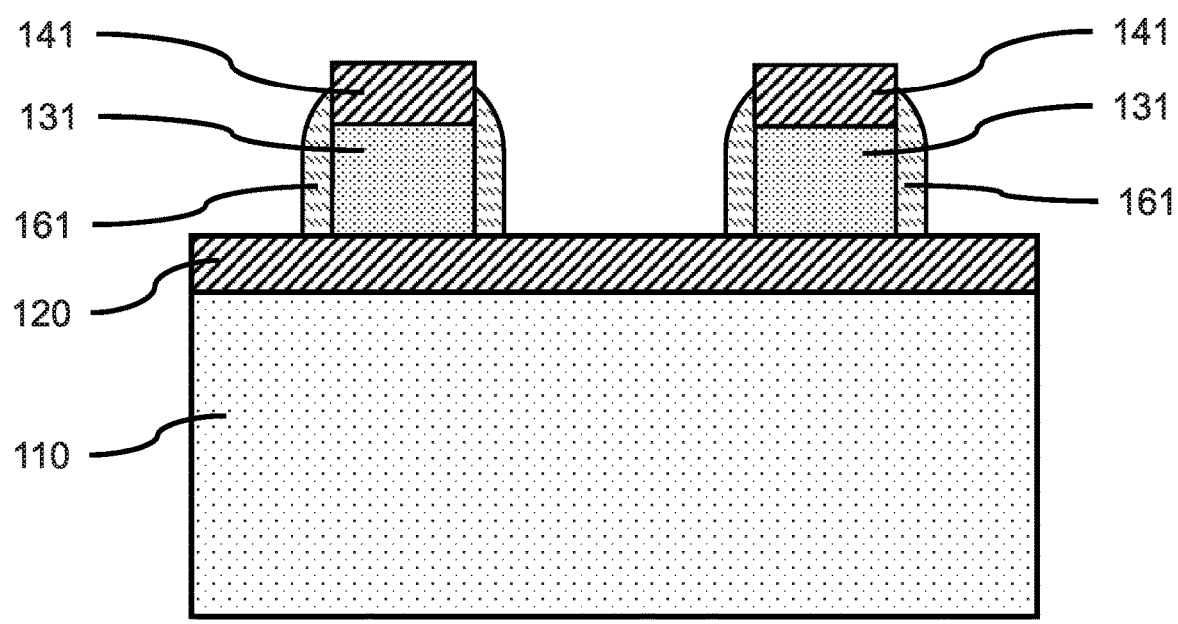
FIG. 6 is a cross-sectional side view showing sidewalls spacers formed on opposite sides of the sacrificial mandrels, in accordance with an embodiment of the present invention.

FIG. 6 is a cross-sectional side view showing sidewalls spacers formed on opposite sides of the sacrificial mandrels, in accordance with an embodiment of the present invention.

In one or more embodiments, a portion of the sidewall spacer layer 160 on the fin template layer 120 and the top surfaces of the mandrel templates 141 can be removed by an etch-back process using a directional etch, for example, RIE to remove the portion of the sidewall spacer layer on surfaces approximately perpendicular to the incident ion beam, while the sidewall spacer layer 160 on the vertical sidewalls of the sacrificial mandrels 131 remain essentially unetched. In one or more embodiments, a portion of the sidewall spacer layer 160 on the top surfaces of the mandrel templates 141 can be removed by a chemical-mechanical polishing (CMP) to expose the underlying mandrel templates 141. The remaining portion of the sidewall spacer layer 160 on the sacrificial mandrels 131 can form sidewall spacers 161.

In various embodiments, a plurality of vertical fins can be formed by a sidewall image transfer (SIT) process, self-aligned double patterning (SADP), or self-aligned quadruple patterning (SAQP) to provide a tight pitch between vertical fins. In various embodiments, a direct print can be used to provide fins with a looser pitch. Immersion Lithography can direct print down to about 78 nm pitch. Self-aligned double patterning (SADP) can achieve down to about 40 nm to 60 nm fin pitch. Self-aligned quadruple patterning (SAQP) may be used to go down to below 40 nm fin pitch.

Figure 7:
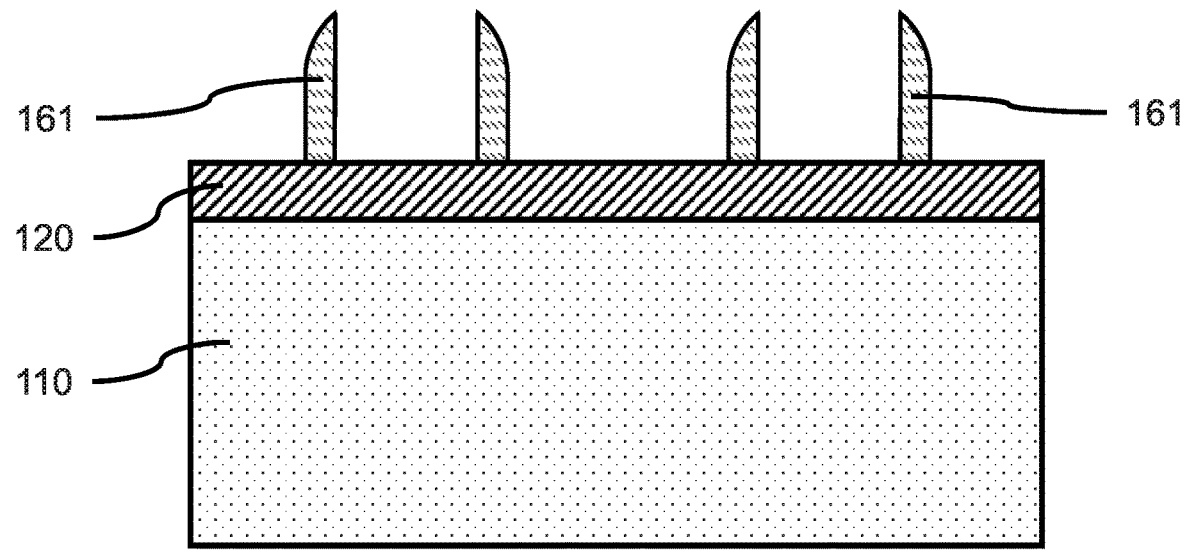
FIG. 7 is a cross-sectional side view showing sidewall spacers formed on the fin template layer after removal of the sacrificial mandrels, in accordance with an embodiment of the present invention.

FIG. 7 is a cross-sectional side view showing sidewall spacers formed on the fin template layer after removal of the sacrificial mandrels, in accordance with an embodiment of the present invention.

In one or more embodiments, the mandrel templates 141 and sacrificial mandrels 131 can be removed after the sidewalls spacers 161 are formed, where the mandrel templates 141 and sacrificial mandrels 131 can be removed by selective etching (e.g., RIE or wet etch). The mandrel templates 141 and sacrificial mandrels 131 can be selectively removed, while the sidewalls spacers 161 remain on the fin template layer 120 forming a fin pattern. The sidewalls spacers 161 can be made of a different material from the mandrel templates 141 and sacrificial mandrels 131, so the mandrel templates 141 and sacrificial mandrels 131 can be selectively removed.

Figure 8:
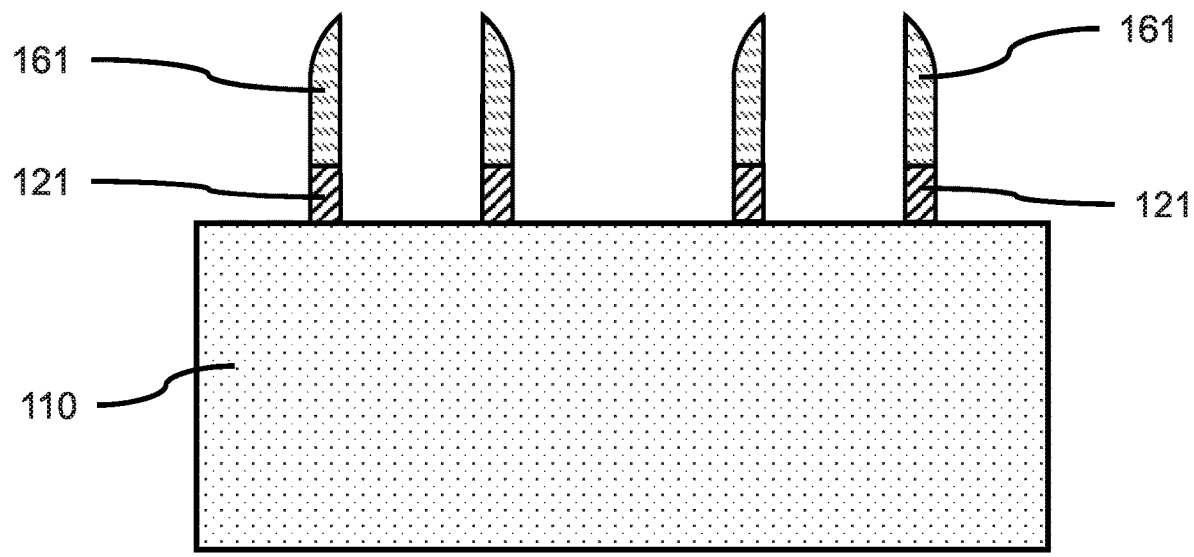
FIG. 8 is a cross-sectional side view showing fin templates formed on the substrate and sidewall spacers on each fin template, in accordance with an embodiment of the present invention.

FIG. 8 is a cross-sectional side view showing fin templates formed on the substrate and sidewall spacers on each fin template, in accordance with an embodiment of the present invention;

In one or more embodiments, the fin pattern formed by the sidewalls spacers 161 can be transferred to the fin template layer 120 by removing the exposed portion of the fin template layer 120. In various embodiments, a portion of the fin template layer 120 can be removed to form a fin template 121 below each of the one or more sidewall spacers 161 by a directional RIE. Removal of the portions of the fin template layer 120 can expose portions of the underlying substrate 110, surface/active layer(s), or source/drain layer(s) between each of the sidewall spacers 161 and fin templates 121.

Figure 9:
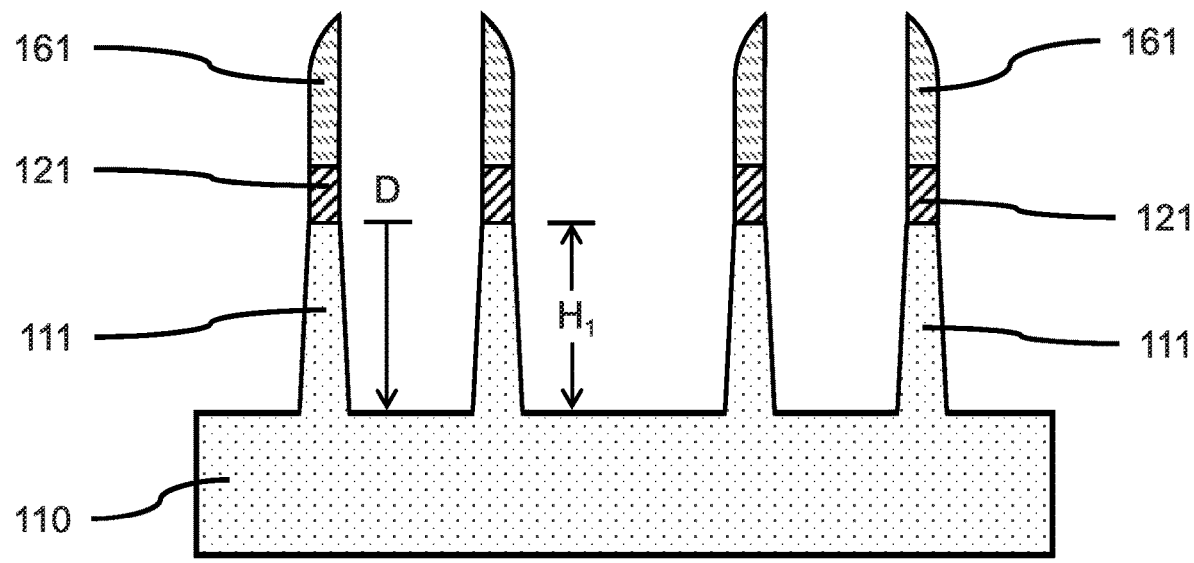
FIG. 9 is a cross-sectional side view showing a plurality of vertical fins formed on the substrate with a fin template and a sidewall spacer on each vertical fin, in accordance with an embodiment of the present invention.

FIG. 9 is a cross-sectional side view showing a plurality of vertical fins formed on the substrate with a fin template and a sidewall spacer on each vertical fin, in accordance with an embodiment of the present invention.

In one or more embodiments, one or more vertical fin(s) 111 can be formed on the substrate 110 or a surface active layer, where the vertical fin(s) 111 can be formed by removing a portion of the substrate 110 between and/or around a sidewall spacer 161 and fin template 121. The one or more vertical fin(s) 111 can be formed by a directional etch, for example, a reactive ion etch (RIE) that removes the portion of the substrate or surface active layer not covered by a sidewall spacer 161. The removal of the substrate material can form vertical fin(s) 111 with a tapered profile having a greater width at the base of the vertical fin(s) and a narrower width at the top of the fin(s), or with a straight profile (i.e., an essentially uniform width), where the straight or tapered profile can be produced as an aspect of the etching process.

In one or more embodiments, trenches can be formed in the substrate or surface active layer between and/or around a sidewall spacer 161 and fin template 121 to a depth, Di, in the range of about 30 nm to about 90 nm, or in the range of about 30 nm to about 50 nm, or about 45 nm, where the vertical fin(s) 111 formed in the substrate can have a resulting height, Hi, equal to the depth of the trench. The vertical fin(s) 111 can have a tapered profile with a width at the base greater than the width of the sidewall spacer 161 and fin template 121 on the top surface 113.

In non-limiting exemplary embodiments, the substrate 110 can be a single crystal silicon (Si) wafer or a single crystal silicon-germanium ($Si_xGe_y$) wafer, or the substrate can include a single crystal silicon (Si) or single crystal silicon-germanium active layer ($Si_xGe_y$) at the surface of the substrate 110 (i.e., surface active layer) from which a plurality of vertical fins can be formed. The vertical fins 111 can be undoped to provide fully depleted device channels.

In one or more embodiments, the vertical fin(s) 111 can have a length in the range of about 20 nm to about 60 nm, or about 30 nm to about 50 nm, where the vertical fin length can be equal to or greater than the width, $W_1$. The vertical fin(s) 111 can have a substantially (e.g., with rounded edges and rough/uneven surfaces) square or rectangular cross-section parallel with the plane of the substrate 110.

In one or more embodiments, the vertical fins(s) 111 can be strained or unstrained fin(s), for example, a strained $Si_xGe_{(1-x)}$ nFET and/or an unstrained silicon pFET, or a III-V nFET to provide high carrier mobility. The vertical fin(s) 111 on the substrate may be used to fabricate one or more vertical transport fin field effect transistors (VT FinFETs). The VT FinFETs may be electrically coupled to form CMOS devices, where an nFET and a pFET are coupled to form the CMOS device.

Figure 10:
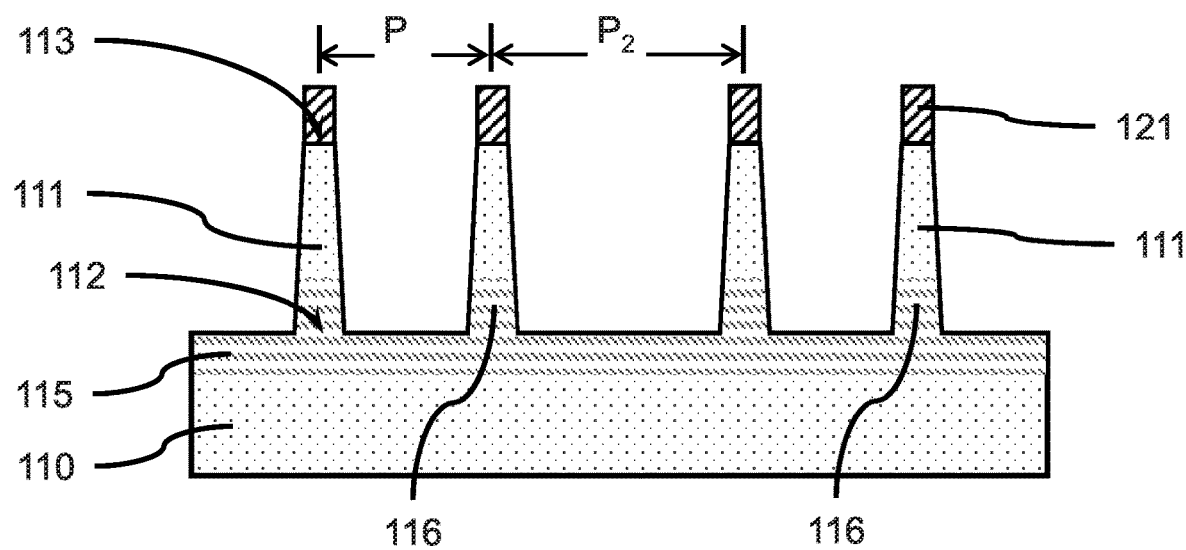
FIG. 10 is a cross-sectional side view showing a fin template remaining on each tapered vertical fin after removal of the sidewall spacers, and a source/drain region below the vertical fins, in accordance with an embodiment of the present invention.

FIG. 10 is a cross-sectional side view showing a fin template remaining on each tapered vertical fin after removal of the sidewall spacers, and a source/drain region below the vertical fins, in accordance with an embodiment of the present invention.

In one or more embodiments, the sidewall spacers 161 can be removed from the fin templates 121 and vertical fins 111. The vertical fins 111 can have tapered sidewall profiles, where the base 112 of a vertical fin 111 has a greater width, $W_2$, than the width, $W_1$, at the top surface 113 of the vertical fin 111. The sidewall spacers 161 can be removed, for example, by an isotropic dry etch, a selective RIE process, or a selective wet etch. The underlying fin template(s) 121 can act as an etch stop. The fin template(s) 121 can remain on the vertical fin(s) 111 after the sidewall spacers 161 are removed, and be subsequently removed by a separate selective etch.

In one or more embodiments, the width, $W_1$, at the top surface 113 of the vertical fin can be in the range of 6 nm to about 10 nm, and the width, $W_2$, at the base 112 of the vertical fin can be about 2 nm to about 4 nm wider than the width, $W_1$.

In one or more embodiments, the vertical fins 111 can have a pitch or center-to-center distance, $P_1$, $P_2$, determined by the pitch and width of the sacrificial mandrels 131. In various embodiments, the vertical fins 111 can have a pitch, $P_1$, as determined by the width of the sacrificial mandrels 131 in the range of about 20 nm to about 60 nm, or in the range of about 30 nm to about 40 nm. In various embodiments, the vertical fins 111 can have a pitch, $P_2$, as determined by the pitch between two adjacent sacrificial mandrels 131 in the range of about 20 nm to about 100 nm, or in the range of about 30 nm to about 90 nm, or in the range of about 40 nm to about 70 nm, where the pitch, $P_1$, can be equal to the pitch, $P_2$. In various embodiments, the pitch, $P_1$, and the pitch, $P_2$, can be equal, or $P_1$ and $P_2$ can be different, where the difference can be due to pitch walking. The present approach can provide a uniform thickness to a bottom spacer when there are different/variable pitches between neighboring vertical fins 111.

In one or more embodiments, a bottom source/drain region 115 can be formed at the surface of the substrate, where the bottom source/drain region 115 can be formed by implantation of an n-type or p-type doping species, by epitaxially growing a doping layer on the surface of the substrate and vertical fin(s) 111, or a combination thereof. The bottom source/drain can be a combination of both an epitaxial doping layer and dopant implantation to achieve a higher dopant density than that achievable by either alone. The doping layer can be epitaxially grown before or after vertical fin patterning. The implantation and/or epitaxially grown doping layer can be followed by one or more anneals to allow dopants to diffuse laterally into the region below each of the vertical fin(s) 111. The doping species may also diffuse into a lower portion of the vertical fin(s) 111 to form extension regions 116 at the base 112 of a vertical fin 111. The bottom junction for the bottom source/drain can be formed prior to forming a bottom spacer, but after forming the vertical fin(s) 111. Other suitable doping techniques may also be used, including but not limited to, gas phase doping, plasma doping, plasma immersion ion implantation, cluster doping, infusion doping, liquid phase doping, solid phase doping, or combinations thereof.

Figure 11:
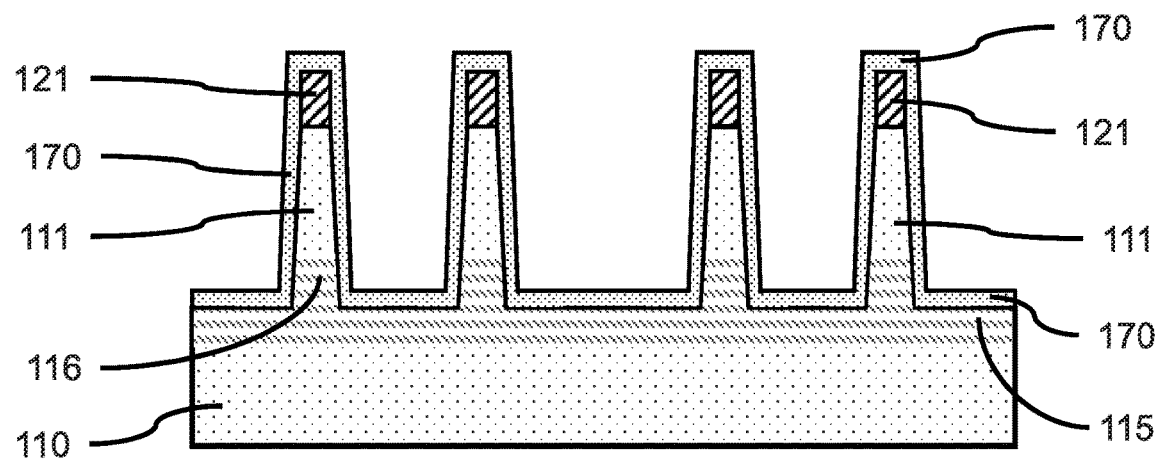
FIG. 11 is a cross-sectional side view showing a liner layer on the vertical fins fin templates, and substrate, in accordance with an embodiment of the present invention.

FIG. 11 is a cross-sectional side view showing a liner layer on the vertical fins fin templates, and substrate, in accordance with an embodiment of the present invention.

In one or more embodiments, a liner layer 170 can be formed on the exposed surfaces of the vertical fin(s) 111 and exposed surface of the substrate 110, where the liner layer 170 can be formed by a conformal deposition on the vertical fin(s) 111 by Thermal ALD, PEALD, pulsed plasma CVD, or combinations thereof. In various embodiments, the liner layer 170 is not formed by a directional deposition, including, but not limited to, high density plasma (HDP) depositions and gas cluster ion beam (GCIB) depositions. In various embodiments, the liner layer 170 is not formed by CVD, LPCVD, or PECVD.

In one or more embodiments, the liner layer 170 can be a silicon oxide (SiO), a carbon-doped silicon oxide (SiOC), or combinations thereof. A silicon oxide can include stoichiometric silicon dioxide ($SiO_2$) and other stoichiometric ratios of silicon and oxygen.

In one or more embodiments, the liner layer 170 can have a thickness in the range of about 0.5 nm to about 10 nm, or in the range of about 0.5 nm to about 5 nm, or about 1 nm to about 5 nm, or about 1 nm to about 3 nm, although other thicknesses are contemplated.

Figure 12:
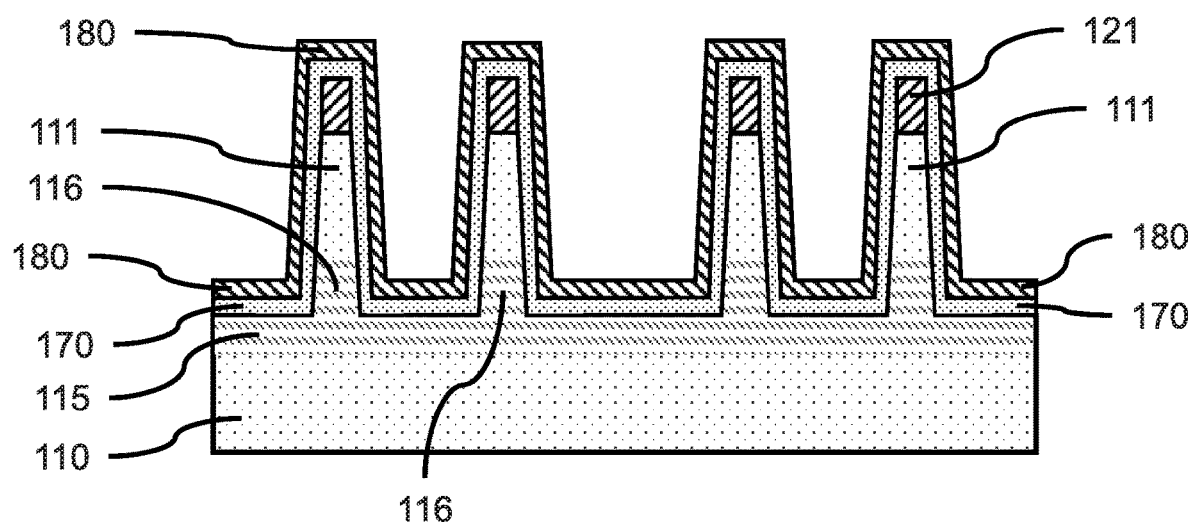
FIG. 12 is a cross-sectional side view showing a spacer layer on the liner layer over the vertical fins, fin templates, and substrate, in accordance with an embodiment of the present invention.

FIG. 12 is a cross-sectional side view showing a spacer layer on the liner layer over the vertical fins fin templates, and substrate, in accordance with an embodiment of the present invention.

In one or more embodiments, a spacer layer 180 can be formed on the liner layer 170 over the vertical fin(s) 111 and substrate 110, where the spacer layer 180 can be formed by a conformal deposition on the vertical fin(s) 111 by Thermal ALD, PEALD, pulsed plasma CVD, or combinations thereof. In various embodiments, the spacer layer 180 is not formed by a directional deposition, including, but not limited to, high density plasma (HDP) depositions and gas cluster ion beam (GCIB) depositions. In various embodiments, the spacer layer 180 is not formed by PECVD.

In one or more embodiments, the spacer layer 180 can be a silicon nitride (SiN), a carbon-doped silicon nitride (SiCN), a silicon oxynitride (SiON), silicon boro carbonitride (SiBCN), silicon oxycarbonitride (SiOCN), or combinations thereof. The silicon nitride can include stoichiometric silicon nitride ($Si_3N_4$) and other stoichiometric ratios of silicon and nitrogen.

In one or more embodiments, the spacer layer 180 can have a thickness in the range of about 0.5 nm to about 10 nm, or in the range of about 0.5 nm to about 5 nm, or about 1 nm to about 5 nm, or about 3 nm to about 8 nm, although other thicknesses are contemplated.

In one or more embodiments, the vertical fins 111 can be a crystalline semiconductor with a predetermined crystal orientation, where removal of the one or more exposed fin templates 121 exposes a crystalline surface.

Figure 13:
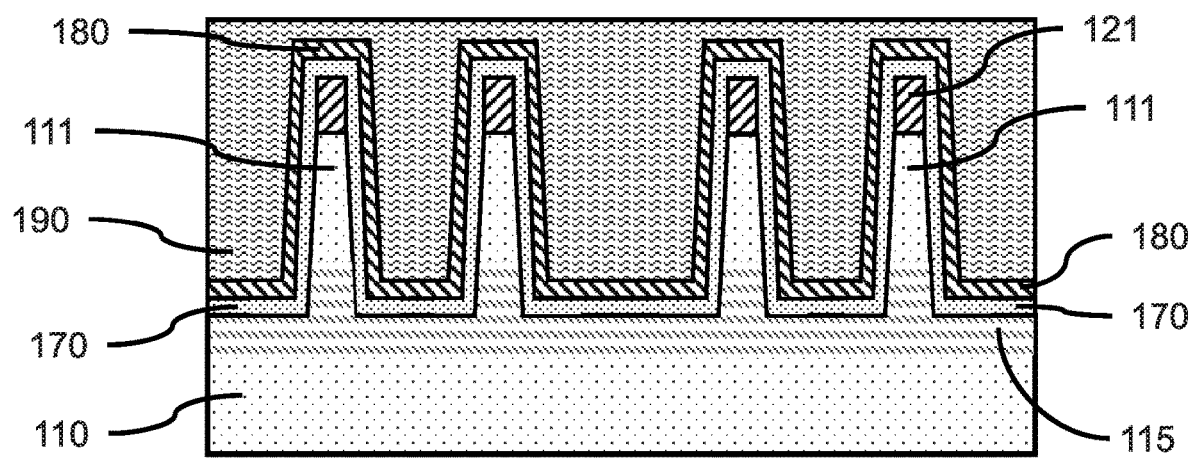
FIG. 13 is a cross-sectional side view showing a gauge layer on the spacer layer and between the vertical fins, in accordance with an embodiment of the present invention.

FIG. 13 is a cross-sectional side view showing a gauge layer on the spacer layer and between the vertical fins, in accordance with an embodiment of the present invention.

In one or more embodiments, a gauge layer 190 can be formed on the exposed surfaces of the spacer layer 180, where the gauge layer 190 can be formed by a blanket deposition, for example, flowable CVD (e.g., $SiO_2$), eHARP, a spin-on process, or a combination thereof.

In one or more embodiments, the gauge layer 190 can be silicon dioxide (SiO$_2$), a low-k dielectric, a flowable polymeric material, or a combination thereof. A low-k dielectric material can include, but not be limited to, carbon-doped silicon oxide (SiOC), a fluoride-doped silicon oxide (e.g., fluoride doped glass), amorphous carbon, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 14:
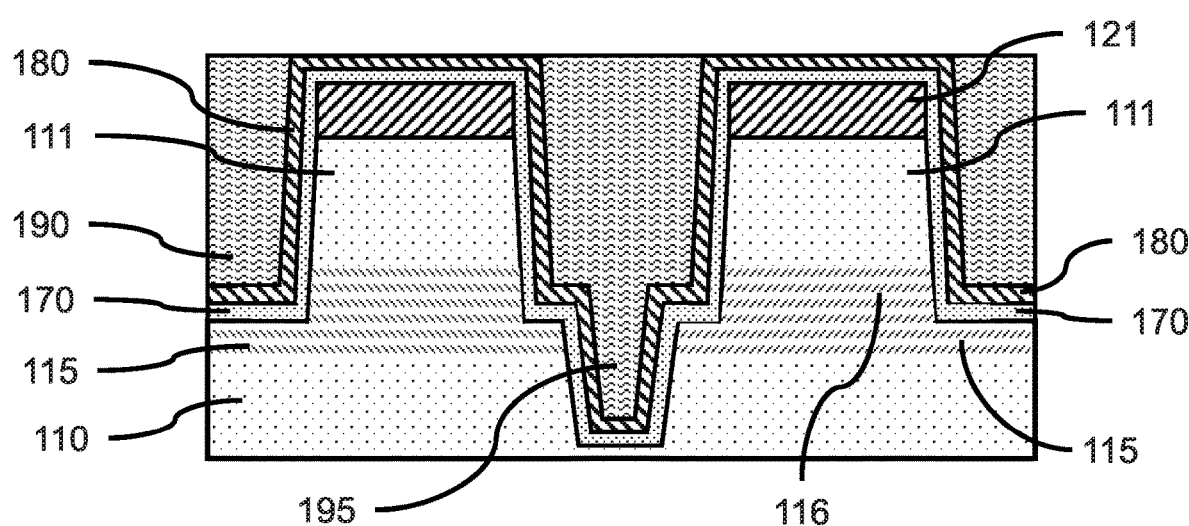
FIG. 14 is a cross-sectional side view of the long axis of the vertical fins showing a gauge layer on the spacer layer, and an isolation region between the vertical fins, in accordance with an embodiment of the present invention.

FIG. 14 is a cross-sectional side view of the long axis of the vertical fins showing a gauge layer on the spacer layer, and an isolation region between the vertical fins, in accordance with an embodiment of the present invention.

In one or more embodiments, the portion of the gauge layer 190 extending above the top surface of the spacer layer 180 on the fin templates 121 can be removed, for example, by a chemical-mechanical polishing (CMP) to provide a smooth, planarized surface to the gauge layer 190. The top surfaces of the spacer layer 180 on the fin templates 121 can be exposed by removal of the upper portion of the gauge layer 190.

In one or more embodiments, the gauge layer 190 can fill in an isolation region trench to form an isolation region 195 (e.g., a shallow trench isolation region) between two vertical fins 111. The isolation region trench can be lined with the liner layer 170 and spacer layer 180. In various embodiments, a first vertical fin 111 can be configured to be an n-type FinFET, and a second vertical fin 111 adjacent to the first vertical fin 111 can be configured to be a p-type FinFET, where the bottom source/drain region 115 below the first vertical fin 111 and extension region 116 can be suitably doped to form an n-type FinFET (shown as left-diagonal hatching), and the bottom source/drain region 115 below the second vertical fin 111 and extension region 116 can be suitably doped to form a p-type FinFET (shown as right-diagonal hatching). The isolation region 195 can physically and electrically separate bottom source/drain region 115 below the first vertical fin 111 and the bottom source/drain region 115 below the second vertical fin 111, such that the n-type FinFET and p-type FinFET are electrically isolated. A portion of the vertical fins 111 forming the n-type FinFET and p-type FinFET can be undoped to provide a fully depleted device channel.

Figure 15:
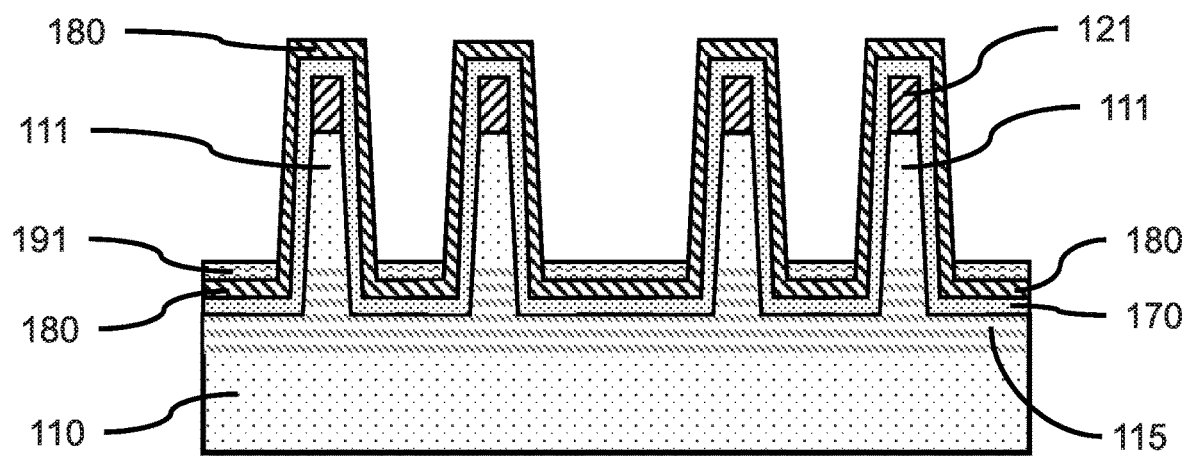
FIG. 15 is a cross-sectional side view showing the gauge layer with a reduced height between the vertical fins, in accordance with an embodiment of the present invention.

FIG. 15 is a cross-sectional side view showing the gauge layer with a reduced height between the vertical fins, in accordance with an embodiment of the present invention.

In one or more embodiments, a portion of the gauge layer 190 can be removed to form gauge sections 191 on the spacer layer 180 between and/or around vertical fin(s) 111, where the gauge sections 191 can cover the portions of the spacer layer 180 between vertical fins 111. The portion of the gauge layer 190 removed can reduce the height (i.e., thickness) of the gauge layer 190 to a predetermined value for the intended depth of a U-shaped spacer trough, or L-shaped spacer trough where the spacer layer has a fin along only one side, formed from the spacer layer 180. The sidewalls 182 of the spacer trough 181 can have an inside height equal to the thickness of the gauge section 191. In various embodiments, the height of the leg of the spacer trough up the side of the vertical fin 111 can depend of the intended channel length of the FinFET.

In various embodiments, the height of the extension region 116 from the base 112 of the vertical fin 111 can be equal to the height of the leg of the spacer trough up the side of the vertical fin 111 to minimize resistance and provide a predetermined channel length.

In one or more embodiments, the portion of the gauge layer 190 can be removed using a selective, isotropic etch (e.g., wet etch, dry etch, such as COR, a remote plasma etch (e.g., SiCoNi™), etc.) that preferentially removes the material of the gauge layer 190, while leaving the spacer layer 180 on the liner layer 170 covering the sidewalls of the vertical fin(s) 111 and the fin templates 121. The etch process can also be a directional etch, for example, reactive ion etch (RIE) that preferentially removes the material of the gauge layer 190. The etch can be a timed etch to remove a predetermined amount of the gauge layer 190, or it could be a combination of a wet etch, isotropic dry etch, and/or directional etch (e.g., RIE) in various sequences.

In one or more embodiments, the gauge section 191 can have a height (i.e., thickness) in the range of about 1 nm to about 6 nm, or in the range of about 1 nm to about 5 nm, or in the range of about 1 nm to about 4 nm.

In one or more embodiments, the height of the gauge layer 190 can be reduced to expose the spacer layer 180 on the upper portion of the vertical fin(s) 111. The gauge layer 190 can be recessed below the height of the vertical fin(s) 111.

Figure 16:
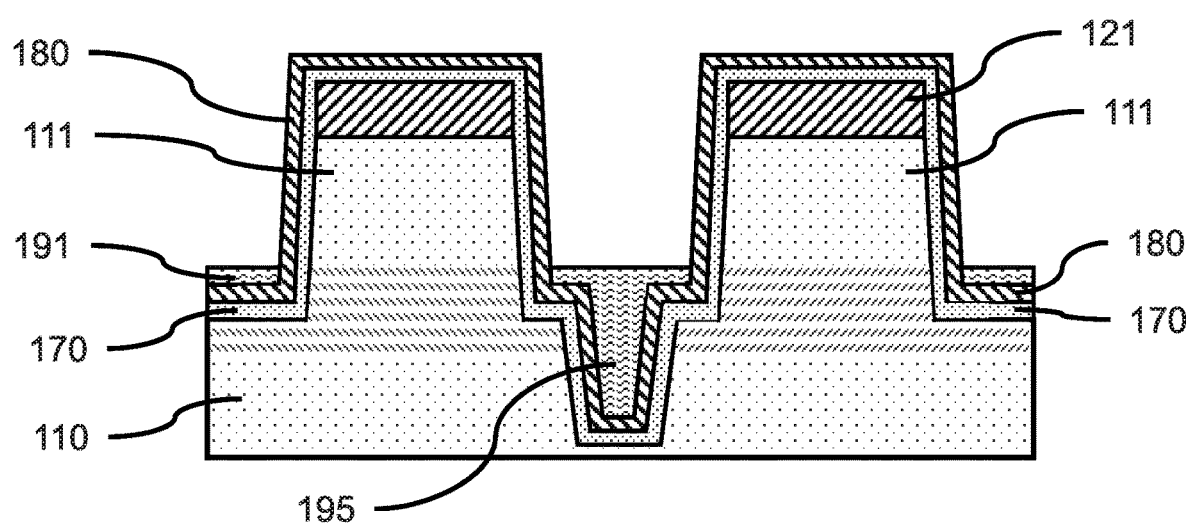
FIG. 16 is a cross-sectional side view of the long axis of the vertical fins showing the gauge layer with a reduced height between the vertical fins, in accordance with an embodiment of the present invention.

FIG. 16 is a cross-sectional side view of the long axis of the vertical fins showing the gauge layer with a reduced height between the vertical fins, in accordance with an embodiment of the present invention.

In one or more embodiments, the height of the gauge layer 190 can be reduced to expose the spacer layer 180 on the upper portion of the vertical fin(s) 111, while covering a lower portion of the spacer layer 180. The gauge layer 190 can be recessed to a predetermined height above the base 112 of the vertical fin(s) 111. The material of the gauge layer 190 remains in the isolation region 195 between the two adjacent fins, where one fin can form a pFET and the other fin can form an nFET.

Figure 17:
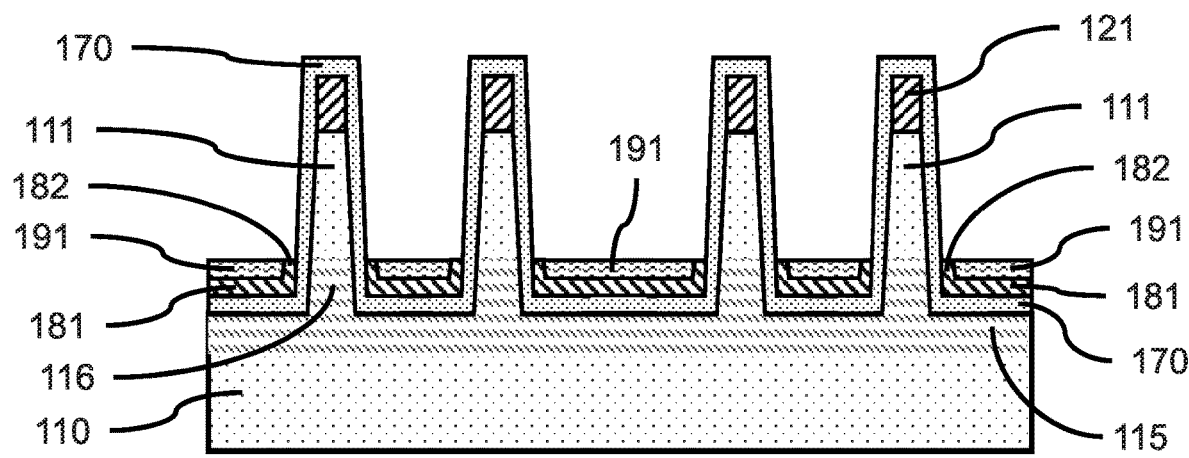
FIG. 17 is a cross-sectional side view showing the spacer layer trimmed to the height of the gauge layer to produce a spacer trough, in accordance with an embodiment of the present invention.

FIG. 17 is a cross-sectional side view showing the spacer layer trimmed to the height of the gauge layer to produce a spacer trough, in accordance with an embodiment of the present invention.

In one or more embodiments, the exposed portion of the spacer layer 180 can be removed using an isotropic etch (e.g., wet etch, dry isotropic etch, such as, SiCoNi™ etch, or chemical oxide removal (COR) etch, etc.) selective for the material of the spacer layer 180 to form a U-shaped spacer trough 181 between two vertical fins 111, or an L-shaped spacer trough 181 adjacent to a single vertical fin 111. The exposed portion of the spacer layer 180 can be removed down to the exposed top surface of the gauge section 191, where the remaining portion of the spacer layer 180 on the vertical fin(s) 111 forms the sidewall(s) 182 of the spacer trough 181. Trimming the spacer layer 180 down to the top surface of the gauge section 191 exposes a portion of the liner layer 170 on the vertical fin(s) 111 and fin template(s) 121. The liner layer 170 can be a different material from the spacer layer 180, so the liner layer acts as an etch stop. The liner layer 170 can protect the fin template(s) 121 which can be the same material as the spacer layer 180 to provide a controlled sequence of etching processes to produce the troughs.

In a non-limiting exemplary embodiment, a silicon dioxide (SiO$_2$) liner layer 170 can be formed on the vertical fin(s) 111 and fin templates 121 by PEALD, and a silicon nitride (Si$_3$N$_4$) spacer layer 180 can be formed on the liner layer 170 by ALD. A flowable silicon oxide (SiO) can be formed by Flowable Chemical Vapor Deposition (FCVD) on the spacer layer 180 and in the gaps between the vertical fins 111 to provide the gauge layer 190. The fin templates 121 can be silicon nitride (Si$_3$N$_4$).

In various embodiments, the gauge layer 190 can be formed by High Aspect Ratio Process (HARP), enhanced High Aspect Ratio Process (eHARP), or high density plasma (HDP). The gauge layer 190 can be cured using ultraviolet (UV) light or ozone ($O_3$), and steam annealed at a temperature in the range of 300° C. to 700° C. to stabilize the layer structure by converting silazane oligomers (—Si—N—Si—) into Si—O—Si to provide a stronger/denser gauge layer 190. A chemical-mechanical polishing (CMP) can be utilized to remove an upper portion and planarize the gauge layer 190. Additionally, selective RIE can be used to remove the upper portion of the SiO gauge layer 190 relative to the silicon nitride ($Si_3N_4$) spacer layer 180 to form the gauge sections 191. The exposed $Si_3N_4$ spacer layer 180 can be trimmed down to the top surface of the gauge section 191 using a selective isotropic etch, for example, a hot phosphoric acid etch, or dry isotropic etch such as "Frontier"™, where the silicon dioxide ($SiO_2$) liner layer 170 prevents removal or damage to the fin template(s) 121 and vertical fin(s) 111. The remaining flowable silicon oxide (SiO) gauge sections 191 can be removed by a selective, directional etch (e.g., RIE) to expose the U-shaped or L-shaped spacer trough(s) 181.

Figure 18:
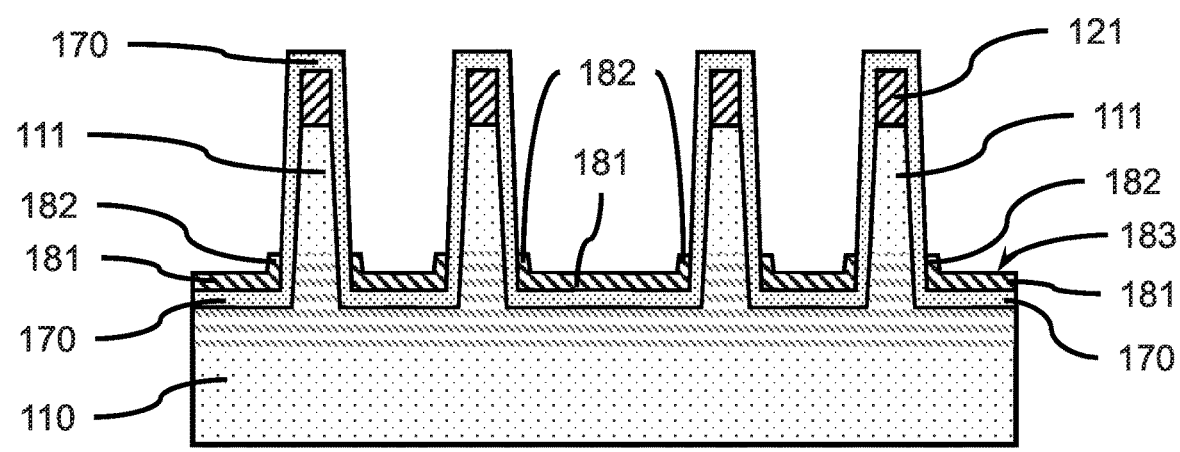
FIG. 18 is a cross-sectional side view showing the L-shaped and U-shaped spacer troughs on the liner layer after removal of a remaining portion of the gauge layer, in accordance with an embodiment of the present invention.

FIG. 18 is a cross-sectional side view showing the L-shaped and U-shaped spacer troughs on the liner layer after removal of a remaining portion of the gauge layer, in accordance with an embodiment of the present invention.

In one or more embodiments, the gauge section(s) 191 can be removed to expose the underlying U-shaped or L-shaped spacer trough(s) 181, where the gauge section(s) 191 can be removed using a selective etch (e.g., wet etch, dry etch, plasma etch, etc.). Removal of the gauge section(s) 191 can leave the sidewalls 182 of the spacer trough(s) 181 extending obliquely or perpendicularly up a portion of a vertical fin 111.

In one or more embodiments, the sidewalls 182 of the spacer trough(s) 181 can have an inside height above the trough surface 183 in the range of about 1 nm to about 5 nm, or in the range of about 2 nm to about 4 nm.

Figure 19:
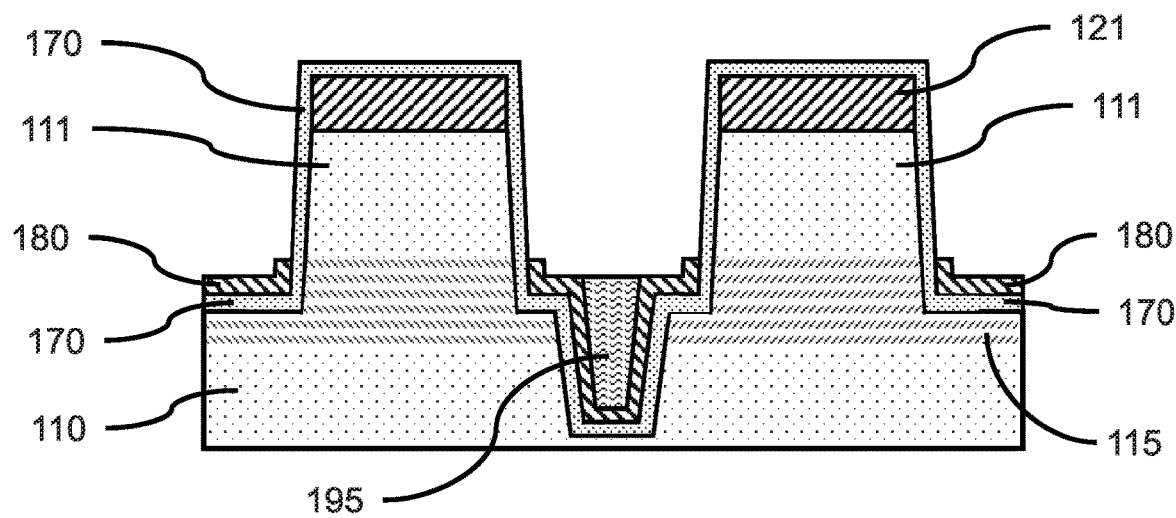
FIG. 19 is a cross-sectional side view of the long axis of the vertical fins showing the spacer troughs on the end walls of the vertical fins, and the remaining portion of the gauge layer in the isolation region between the vertical fins, in accordance with an embodiment of the present invention.

FIG. 19 is a cross-sectional side view of the long axis of the vertical fins showing the spacer troughs on the end walls of the vertical fins, and the remaining portion of the gauge layer in the isolation region between the vertical fins, in accordance with an embodiment of the present invention.

In one or more embodiments, the gauge section(s) 191 can be removed, for example, by a timed etch, to leave a portion of the gauge layer 190 in the isolation trench to form the isolation region 195. The gauge section(s) 191 can be removed down to the level of the trough surface 183, so conductive gate material does not fill in spaces below the level of a channel. The gauge section(s) 191 can be selectively etched relative to the exposed portions of the liner layer 170 and spacer trough(s) 181.

Figure 20:
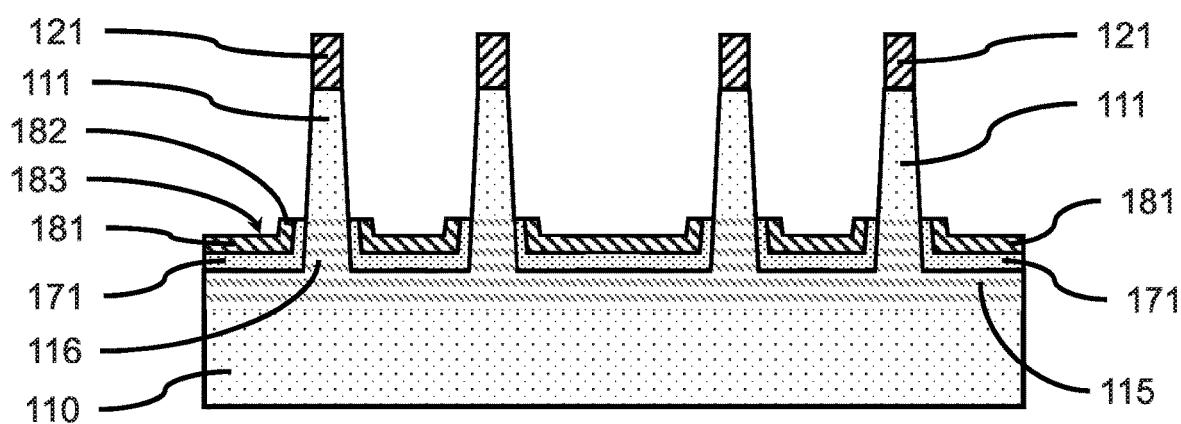
FIG. 20 is a cross-sectional side view showing removal of the exposed portions of the liner layer from each vertical fin and fin template, in accordance with an embodiment of the present invention.

FIG. 20 is a cross-sectional side view showing removal of the exposed portions of the liner layer from each vertical fin and fin template, in accordance with an embodiment of the present invention.

In one or more embodiments, the exposed portions of the liner layer 170 can be removed to expose an upper portion of the vertical fin(s) 111 and fin template(s) 121, where the liner layer 170 can be removed using a selective etch. The portion of the liner layer 170 covered by the sidewalls 182 of the spacer trough(s) 181 can remain to form a U-shaped liner 171 between two vertical fins 111, or an L-shaped liner 171 adjacent to a single vertical fin 111, where the liner is below the U-shaped spacer trough 181 or L-shaped spacer trough 181 respectively. In various embodiments, the combined liner layer 170 and spacer layer 180 can form an L-shaped or U-shaped bottom trough on the end walls of the vertical fins 111. The liner layer 170 can be selectively etched relative to the material in the isolation region and spacer trough 181.

Figure 21:
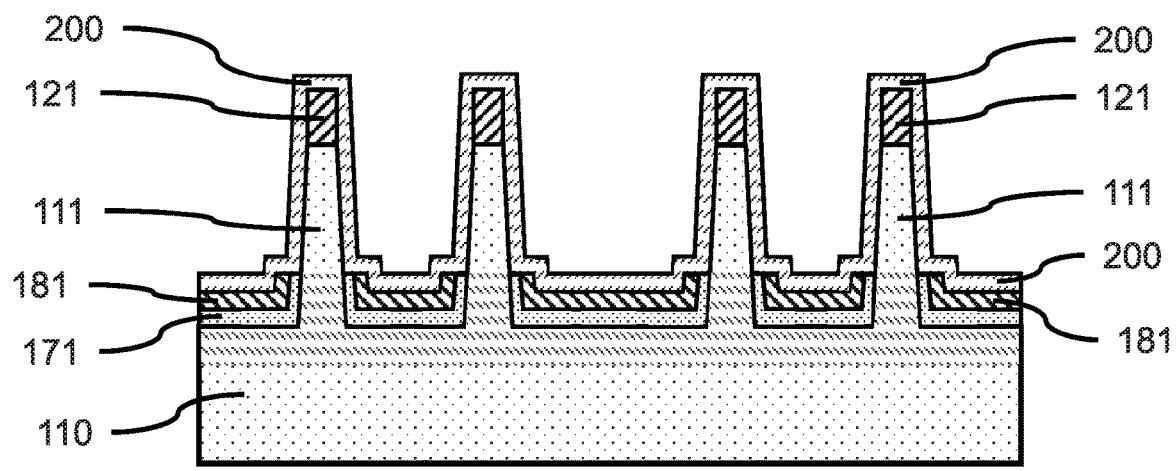
FIG. 21 is a cross-sectional side view showing a gate dielectric layer formed on the vertical fins, fin templates, and exposed surfaces of the spacer trough, in accordance with an embodiment of the present invention.

FIG. 21 is a cross-sectional side view showing a gate dielectric layer formed on the vertical fins, fin templates, and exposed surfaces of the spacer trough, in accordance with an embodiment of the present invention.

In one or more embodiments, a gate dielectric layer 200 can be formed on the exposed surfaces of the fin template(s) 121, vertical fin(s) 111, liners 171, and spacer trough(s) 181, where the gate dielectric layer 200 can be conformally deposited by ALD, PEALD, CVD, PECVD, or combinations thereof.

In one or more embodiments, the gate dielectric layer 200 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 200 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb($Sc_xTa_{1-x}$)$O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, the gate dielectric layer 200 can have a thickness in the range of about 1 nm to about 4 nm, or can have a thickness in the range of about 1 nm to about 2 nm.

Figure 22:
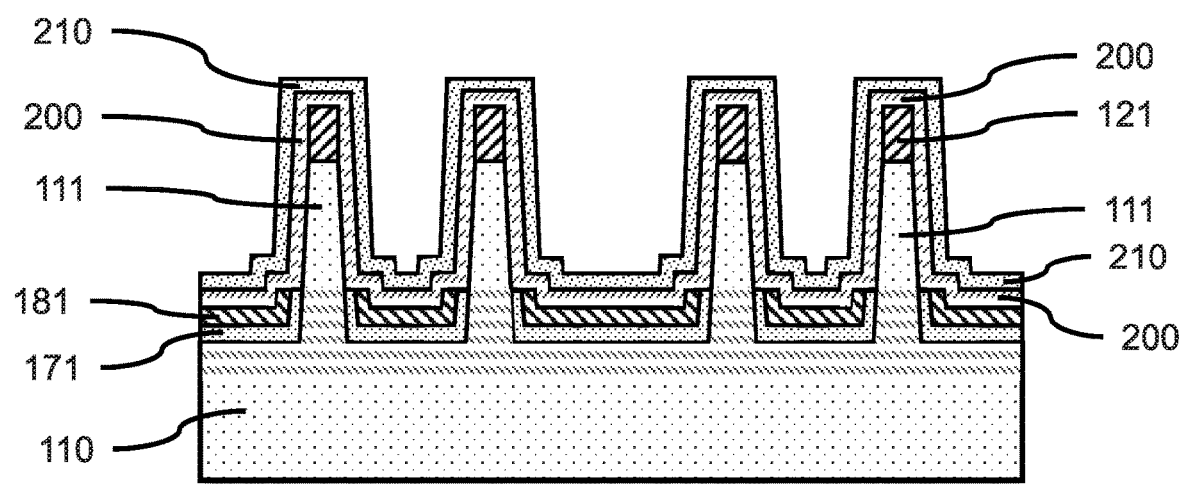
FIG. 22 is a cross-sectional side view showing a work function layer on the gate dielectric layer, in accordance with an embodiment of the present invention.

FIG. 22 is a cross-sectional side view showing a work function layer on the gate dielectric layer, in accordance with an embodiment of the present invention.

In one or more embodiments, a work function layer 210 can be formed on the exposed surfaces of the gate dielectric layer 200, where the work function layer 210 can be conformally deposited by ALD, PEALD, CVD, PECVD, or combinations thereof.

In one or more embodiments, a work function layer 210 can be formed on the gate dielectric layer 200, where the work function layer 210 and gate dielectric layer 200 can surround at least a portion of each of one or more vertical fin(s) 111 as a part of a gate structure. The work function layer 210 can be formed on the gate dielectric layer 200 to adjust the electrical properties of a gate electrode. In various embodiments, the work function layer can be optional. A portion of the work function layer 210 can be formed on the gate dielectric layer 200 on the spacer trough(s) 181 and liner(s) 171.

In various embodiments, a work function layer 210 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 210 can include multiple layers of work function materials, for example, a work function layer can be a TiN/TiC stack.

In various embodiments, the work function layer 210 can have a thickness in the range of about 1 nm to about 11 nm, or can have a thickness in the range of about 1 nm to about 3 nm.

Figure 23:
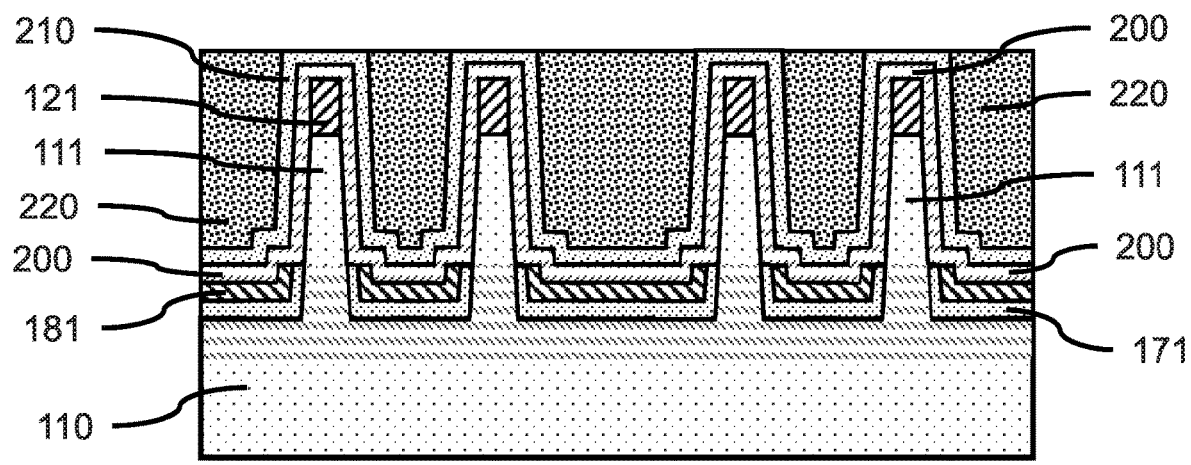
FIG. 23 is a cross-sectional side view showing a gate fill layer on the work function layer, in accordance with an embodiment of the present invention.

FIG. 23 is a cross-sectional side view showing a gate fill layer on the work function layer, in accordance with an embodiment of the present invention.

In one or more embodiments, a gate fill layer 220 can be formed on the gate dielectric layer 200 and/or work function layer 210 if present, where the gate fill layer 220 can fill in the space between vertical fins 111. The gate fill layer 220, gate dielectric layer 200, and optionally the work function layer 210, can form a gate structure on one or more vertical fin(s) 111, where the gate fill layer 220 and work function layer 210 can form a conductive gate electrode.

In various embodiments, the gate fill layer 220 can be a p-doped poly silicon (p-Si), an n-doped poly silicon, a conductive metal, where the metal can be tungsten (W) or cobalt (Co), or a conductive carbon material (e.g., carbon nanotube, graphene, etc.), or any suitable combinations thereof. The gate fill layer 220 can be a heavily p-doped poly silicon to form a pFET, or a heavily n-doped poly silicon to form an nFET.

In one or more embodiments, the gate fill layer 220 can be blanket deposited, and a chemical-mechanical polishing (CMP) used to remove gate fill layer material that extends above the top surfaces of the gate dielectric layer 200 and/or work function layer 210 if present, where the CMP can provide a smooth, flat surface.

Figure 24:
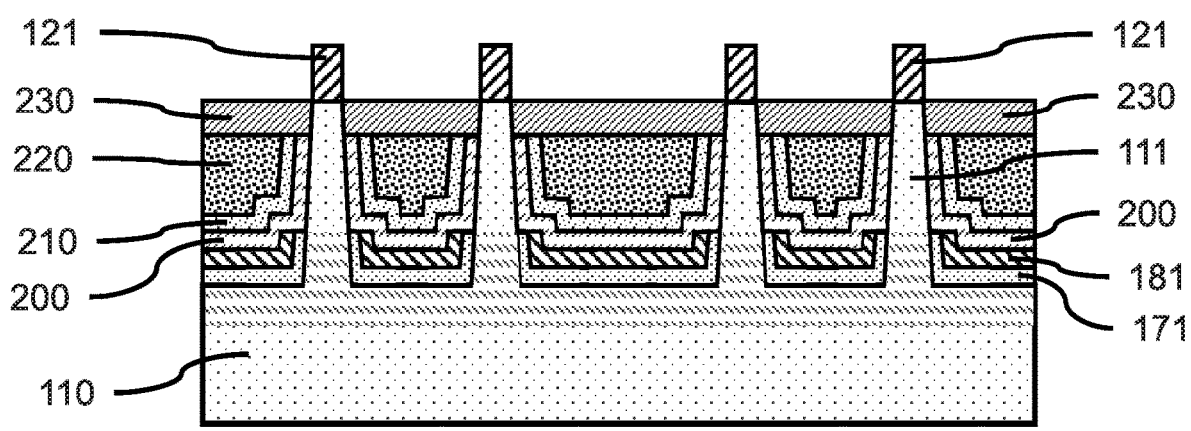
FIG. 24 is a cross-sectional side view showing gate structures formed on the vertical fins, and a top spacer formed on the exposed portions of the gate structure, in accordance with an embodiment of the present invention.

FIG. 24 is a cross-sectional side view showing gate structures formed on the vertical fins, and a top spacer formed on the exposed portions of the gate structure, in accordance with an embodiment of the present invention.

In one or more embodiments, the gate fill layer 220, gate dielectric layer 200 and/or work function layer 210 if present, can be recessed to provide space for formation of a top spacer layer 230. In various embodiments, each of the gate fill layer 220, gate dielectric layer 200 and/or work function layer 210 can be removed using a selective etch. The gate fill layer 220, gate dielectric layer 200 and/or work function layer 210 to a depth equal to or below the fin template(s) 121 to provide space for formation of top source/drains on the top surfaces of the vertical fin(s) 111.

In one or more embodiments, the top spacer layer 230 can be the same material used for either the liner layer 170, the spacer layer 180, or multiple layers thereof.

Figure 25:
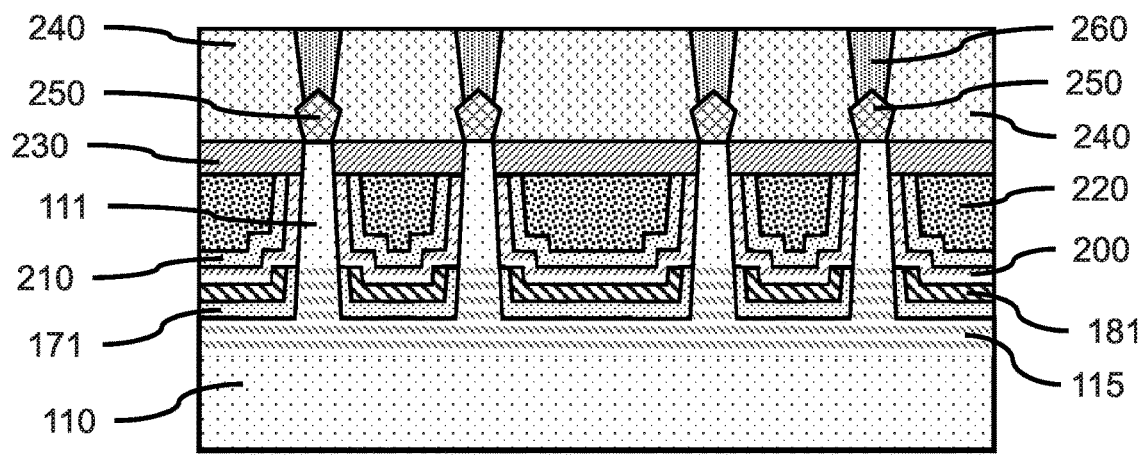
FIG. 25 is a cross-sectional side view showing top source/drains and source/drain contacts on the top surface of each vertical fin, in accordance with an embodiment of the present invention.

FIG. 25 is a cross-sectional side view showing top source/drains and source/drain contacts on the top surface of each vertical fin, in accordance with an embodiment of the present invention.

In one or more embodiments, an interlayer dielectric (ILD) layer 240 can be formed on the exposed surface of the top spacer layer 230, where the interlayer dielectric (ILD) layer 220 can be blanket deposited to fill in the spaces between the vertical fins 111 and/or fin templates 121.

In one or more embodiments, the ILD layer 240 can be silicon oxide (SiO), a low-k dielectric, a flowable polymeric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., hydrogen silsesquioxane (HSQ) and methylsilsesquioxane (MSQ)), or combinations thereof. In various embodiments, the ILD layer 220 can be formed by CVD or spun on.

In one or more embodiments, the height of the ILD layer 220 can be reduced using CMP to expose the top surfaces of the gate dielectric layer 200 or work function layer 210. A selective etch can be used to remove the exposed portions of the gate dielectric layer 200 and work function layer 210 to expose the underlying fin template 121. The fin template 121 can be removed to expose the top surface of the underlying vertical fin 111, where the top surface 113 of the vertical fin 111 can have a crystalline face.

In one or more embodiments, a top source/drain 250 can be formed on each of the vertical fin(s) 111, where the top source/drains 250 can be epitaxially grown on the crystalline top surfaces 113.

In one or more embodiments, the metal electrode(s) 260 can be formed in the ILD layer 240 to provide conductive electrical paths to each of the top source/drains 250 and vertical fins 111 to form a vertical transport FinFET with wrap-around gate structures and U-shaped or L-shaped bottom spacers including liners 171 and spacer troughs 181. Bottom contacts to bottom source/drains can be fabricated at the same time as the metal electrode(s) 260 forming the electrical contacts to the top source/drains 250.

Figure 26:
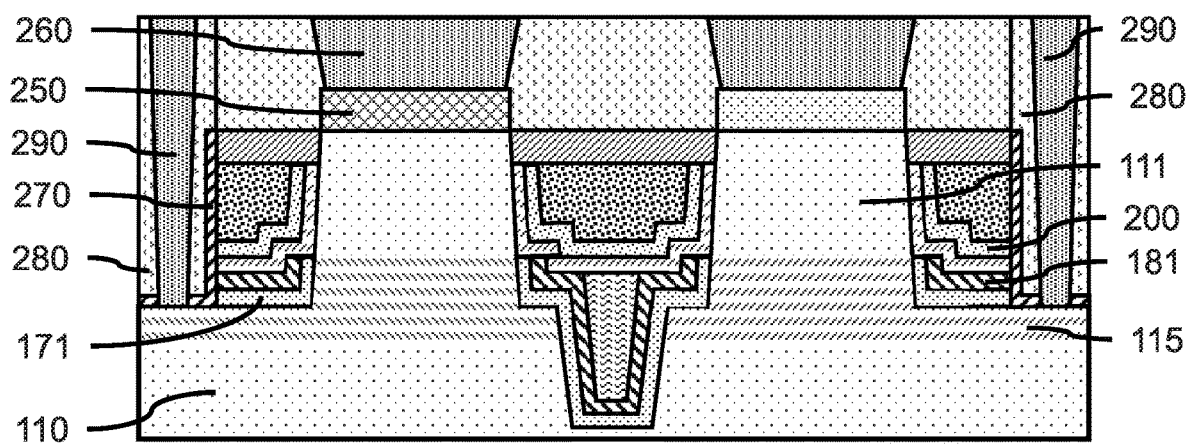
FIG. 26 is a cross-sectional side view of the long axis of the vertical fins showing the vertical fins, gate structures, source/drains, and electrical contacts for an nFET and an adjacent pFET, in accordance with an embodiment of the present invention.

FIG. 26 is a cross-sectional side view of the long axis of the vertical fins showing the vertical fins, gate structures, source/drains, and electrical contacts for an nFET and an adjacent pFET, in accordance with an embodiment of the present invention.

In one or more embodiments, a portion of the bottom trough, gate structure, and ILD layer 240 can be removed to form a bottom source/drain contact 290 to the bottom source/drain region(s) 115. The portions of the bottom trough, gate structure, and ILD layer 240 can be removed by a series of selective masking and etching processes to expose the underlying bottom source/drain region(s) 115. A contact region liner 270 can be formed on the bottom source/drain region(s) 115 and vertical sides of the gate structure(s) and ILD layer 240 to electrically isolate the conductive gate material (i.e., the gate electrode). A second ILD layer 280 can be formed on the contact region liner 270, and a trench or via can be formed in the second ILD layer 280 and contact region liner 270 to expose at least a portion of the bottom source/drain region 115. Bottom source/drain contacts(s) 290 can be formed in the ILD layer 280 to provide conductive electrical paths to each of the bottom source/drain regions 115. The bottom source/drain contacts (s) 290 and metal electrode(s) 260 can be formed at the same time using the same deposition.

A bottom source/drain region 115 and extension region 116 can form a bottom source/drain.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative s such as "beneath," "below." "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term. "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport fin field effect transistor, comprising:
    forming one or more vertical fins on a substrate;
    forming a bottom source/drain region below each of the one or more vertical fins;
    forming a liner layer on the substrate and exposed surfaces of the one or more vertical fins;
    forming a spacer layer on at least a portion of the liner layer;
    forming a gauge layer on the spacer layer;
    removing a portion of the gauge layer to form one or more gauge sections on the spacer layer, where a portion of the spacer layer on the one or more vertical fins is exposed by removing the portion of the gauge layer;
    removing the exposed portion of the spacer layer, wherein removing the exposed portion of the spacer layer s a spacer trough and exposes a portion of the underlying liner layer;

removing the exposed portion of the underlying liner layer on the one or more vertical fins; and removing the one or more gauge sections from the spacer trough(s).

2. The method of forming a vertical transport fin field effect transistor of claim 1, wherein removing the exposed portion of the spacer layer forms an L-shaped or U-shaped spacer trough.

3. The method of forming a vertical transport fin field effect transistor of claim 2, wherein removing the exposed portion of the underlying liner layer forms an L-shaped or U-shaped liner.

4. The method of forming a vertical transport fin field effect transistor of claim 3, further comprising, forming a gate dielectric on the L-shaped or U-shaped spacer trough and exposed surfaces of the one or more vertical fins.

5. The method of forming a vertical transport tin field effect transistor of claim 4, wherein the spacer layer has a thickness in the range of about 3 nm to about 8 nm.

6. The method of forming a vertical transport fin field effect transistor of claim 5, wherein the liner layer has a thickness in the range of about 1 nm to about 3 nm.

7. A method of forming a vertical transport fin field effect transistor, comprising:

forming a first and a second vertical fin on a substrate;

forming a U-shaped liner layer on the substrate between the first and the second vertical fins;

forming a U-shaped spacer trough on the U-shaped liner layer, wherein a sidewall of the U-shaped liner layer separates a sidewall of the U-shaped spacer trough from a sidewall of the first vertical fin; and forming a gate structure in the U-shaped spacer trough.

8. The method of forming a vertical transport fin field effect transistor of claim 7, wherein the U-shaped liner layer has a thickness in the range of about 1 nm to about 3 nm.

9. The method of forming a vertical transport fin field effect transistor of claim 7, wherein the gate structure includes a conformally deposited gate dielectric layer on the surfaces of the first and the second vertical fins and the U-shaped spacer trough.

10. The method of forming a vertical transport fin field effect transistor of claim 9, wherein the gate structure includes a work function layer on the gate dielectric layer, and a gate fill layer on the work function layer, and further comprising forming a bottom source/drain region below each of the one or more vertical fins.

\* \* \* \* \*